United States Patent [19]

Kogure

[11] 4,191,906
[45] Mar. 4, 1980

[54] TUNING FORK TYPE QUARTZ CRYSTAL RESONATOR WITH NOTCHED TINES

[75] Inventor: Shigeru Kogure, Suwa, Japan

[73] Assignee: Kabushiki Kaisha Suwa Seikosha, Suwa, Japan

[21] Appl. No.: 936,941

[22] Filed: Aug. 25, 1978

[30] Foreign Application Priority Data

Jan. 26, 1978 [JP] Japan .................................. 53-7574

[51] Int. Cl.² ........................................... H01L 41/10
[52] U.S. Cl. ..................................... 310/370; 310/312
[58] Field of Search ............. 310/312, 370; 58/23 TF; 84/409, 457

[56] References Cited

U.S. PATENT DOCUMENTS

| 2,870,521 | 1/1959 | Rudnick | 310/312 X |
| 3,683,213 | 8/1972 | Staudte | 310/370 X |
| 3,697,766 | 10/1972 | Ganter et al. | 310/312 X |
| 3,946,257 | 3/1976 | Kawamura | 310/370 |

FOREIGN PATENT DOCUMENTS 2277438  1/1976  Fed. Rep. of Germany .......... 310/370

Primary Examiner—Mark O. Budd

[57] ABSTRACT

A conventional tuning fork type quartz crystal resonator has mainly two vibration modes. They are fundamental vibration mode and overtone having the resonance frequency six times as much as the frequency of fundamental vibration. These two vibration modes have similar high quality factors. When this resonator is put to practical use, there are instances where it oscillates in undesirable mode of vibration. Accordingly, in this invention, concave portions are provided at the tops of resonator in order to prevent it. It is the most effective in case that concave portions are provided in the region of 0.65 to 0.85 from roots of arms.

6 Claims, 8 Drawing Figures (a)

(b)

(c)

(d)

4,191,906

TUNING FORK TYPE QUARTZ CRYSTAL RESONATOR WITH NOTCHED TINES

BACKGROUND OF THE INVENTION

A conventional tuning fork type quartz crystal resonator has mainly two vibration modes. They are fundamental vibration and overtone having the resonance frequency six times as much as the frequency of fundamental vibration. These two vibrations have similar high quality factors (several tens of thousand ~ a hundred and tens of thousand). So this quartz crystal resonator has low crystal impedance. In the case where such a tuning fork type quartz crystal resonator is added in an oscillator circuit, overtone is produced in spite of desiring fundamental vibration due to value of circuit elements, variation of temperature characteristics thereof, supply voltage and dispersion of resonators.

SUMMARY OF THE INVENTION

Generally speaking, in accordance with the invention, a flexural mode quartz crystal resonator comprising a quartz crystal plate defining a tuning fork having two vibrating arms is provided.

Each arm of a tuning fork type quartz crystal resonator is a cantilever, and it vibrates from the root of an arm to the top edge thereof. When the full length of the arm is let to be 1, a rectangular or semicircular concave portion is provided at least in one part in the region of 0.65 to 0.85, so that the overtone of a resonator is suppressed.

Accordingly, it is an object of the invention to provide an improved quartz crystal resonator.

Another object of the invention is to provide a quartz crystal resonator wherein the overtone is suppressed.

A further object of the invention is to suppress the overtone without narrowing the tunability for adjusting the frequency of a resonator when a resonator is employed as a time standard resonator of a timepiece.

Still another object of the invention is to provide a method of producing a quartz crystal resonator having lower crystal impedance.

Still a further object of the invention is to provide a resonator which is stable against the shock when it is dropped.

BRIEF DESCRIPTION OF THE DRAWINGS

FIG. 5(a) illustrates a form of resonator, electrode pattern and a concave portion of a tuning fork type quartz crystal resonator.

FIG. 5(b) illustrated displacement distribution and charge distribution of fundamental vibration in the direction of arm, in case that a concave portion is provided in the region of 0.65 to 0.85 of arm or not provided.

FIG. 5(c) illustrates displacement distribution and charge distribution of overtone in the direction of arm, in case that a concave portion is provided in the region of 0.65 to 0.85 of arm or not provided.

FIG. 5(d) illustrates a quality factor of overtone with respect to the position of concave portion.

DESCRIPTION OF THE PREFERRED EMBODIMENTS

Figure 1:
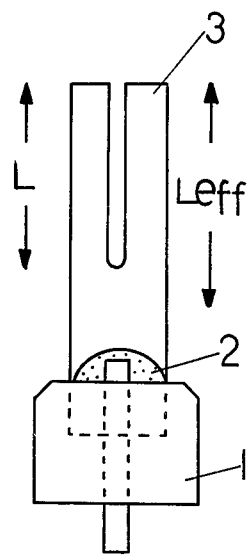
FIGS. 1 and 2 illustrate conventional embodiments of tuning fork type quartz crystal resonator.

FIG. 1 is a general view of a conventional tuning fork type quartz crystal resonator. 1 is a plug. 2 is an adhesive for a supporting member. 3 is a resonator. The resonator is fixed at a tail thereof by a binding agent in the plug, and electrodes are in conduction with a lead pin by the adhesive for the supporting member. The tuning fork type quartz crystal resonator has cantilever arms, and a full length of each arm is from a bottom of the fork to a top of the arm. The full length of each arm is represented by L. However, when the resonator actually vibrates, the strain is also produced even below roots of arms, and the substantial full length of each arm is longer than L. This longer length is called an effective length (hereinafter, referred to as Leff). Leff of overtone is a little longer than that of fundamental vibration. However, since Leff does not reach the supporting member of the resonator, a strain which is produced in the base portion of the tuning fork type quartz crystal resonator by the fundamental vibration and overtone can not be suppressed by the supporting member. As a result, quality factors of fundamental vibration and overtone increase and overtone can be produced according to a construction of an oscillator circuit.

Figure 2:
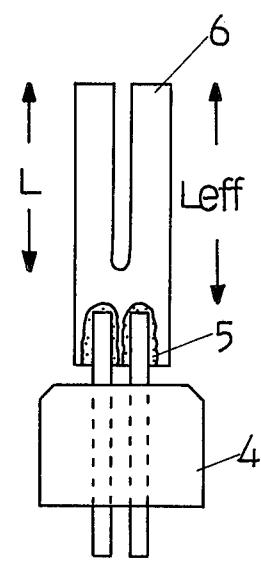

FIG. 2 is a general view of another conventional tuning fork type quartz crystal resonator. 4 is a plug. 5 is an adhesive for supporting member. 6 is a resonator. Unlike the way of supporting the resonator as shown in FIG. 1, the resonator is supported on the plug with two lead pins and the adhesive for supporting member. In the same manner as the case of FIG. 1, since Leff does not reach the supporting member, quality factors of fundamental vibration and overtone are high and there are instances where overtone is produced.

This invention eliminates the above-mentioned faults, and overtone is suppressed in the quartz crystal resonator itself so as to prevent the production of overtone, whatever value the individual oscillator circuit elements take.

Figure 3:
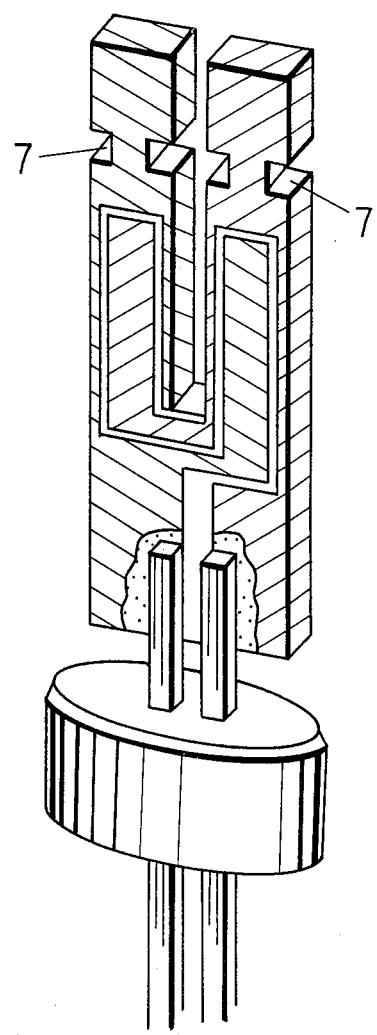
FIG. 3 is a perspective view showing one embodiment of this invention.

FIG. 3 is a perspective view of one embodiment according to this invention. 7 is a rectangular concave portion provided in the region of 0.65 to 0.85 when the root of the arm is 0 (zero) and the top edge thereof is 1 (one). The quality factor of fundamental vibration and overtone is several tens of thousand to a hundred and tens of thousand when the concave portion is not provided. However, by providing the concave portion, only the quality factor of overtone lowers down to several hundred to several thousand, the quality factor of fundamental vibration remaining almost unchanged. That is to say, the production of overtone is suppressed. When the quality factor of overtone lowers down to the value as above mentioned, even if whatever value the individual oscillator circuit elements take, overtone is not produced at all.

Figure 4:
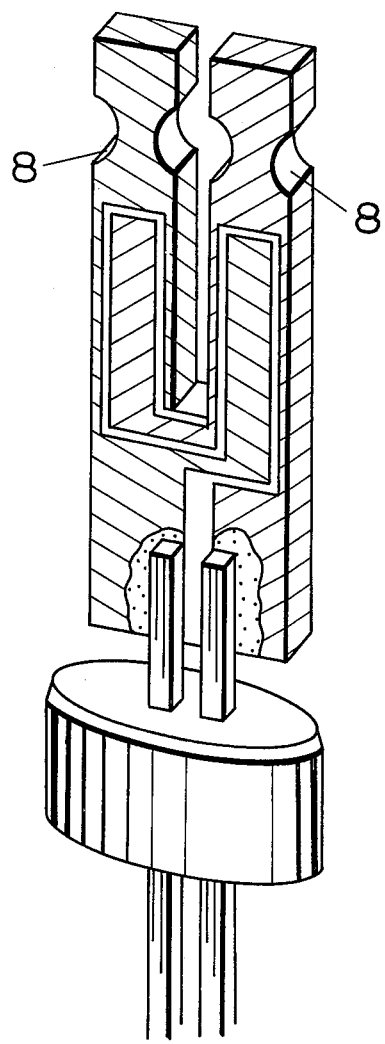
FIG. 4 is a perspective view showing the other embodiment of this invention.

FIG. 4 is a perspective view of the other embodiment according to this invention. 8 is a semicircular concave portion provided in the region of 0.65 to 0.85 of the arm. The effects produced by this concave portion are almost the same as those in FIG. 3, that is to say, the quality factor of fundamental vibration is high up to several tens of thousand to a hundred and tens of thousand, while the quality factor of overtone is extremely low down to several thousand. When the quality factor of overtone is as low as the above-mentioned, even if whatever value the individual oscillator circuit elements take, overtone is not produced at all. As seen from the description concerning two embodiments shown in FIG. 3 and 4, it is obvious that if the portion is concave, regardless of its shape, the same effects can be expected.

One of fundamental ideas for suppressing overtone is to suppress overtone by lengthening not the effective length of fundamental vibration but that of overtone and by means of a supporting member.

Figure 5:
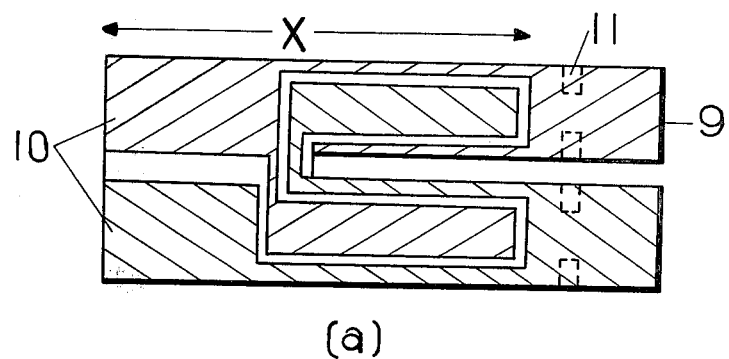
FIG. 5 shows principles of this invention.
Figure 5:
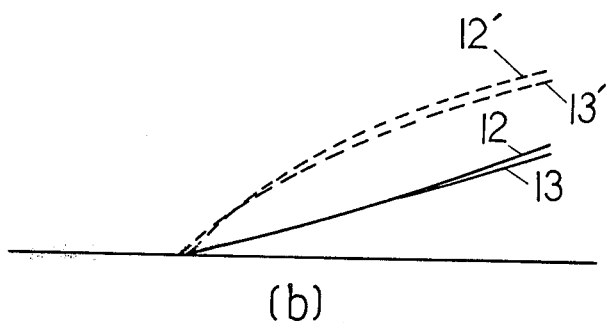
Figure 5:
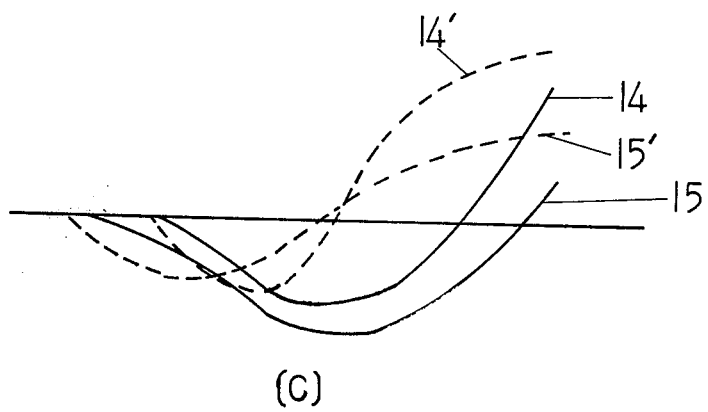
Figure 5:
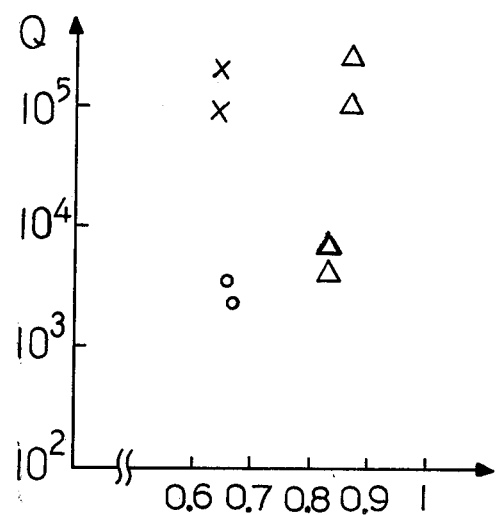

The principle of this invention will be described according to FIGS. 5(a). 5(b) and 5(c). A tuning fork type quartz crystal resonator is shown in FIG. 5(a), wherein 9 is a resonator, 10 is an electrode and 11 is a concave portion. The concave portion is provided in the region of 0.65 to 0.85. The concave portion 11 is one example of concave portions provided in this region, and is provided in the position of 0.75.

FIG. 5(b) shows the displacement distribution and the charge distribution of fundamental vibration in the direction of arm in case that the concave portion 11 is provided in the arm or not provided. 12 and 12' respectively show the displacement distribution and the charge distribution in case that the arm is not provided with any concave portion. 13 and 13' respectively show the displacement distribution and the charge distribution in case that the arm is provided with the concave portion 11.

FIG. 5(c) shows the displacement distribution and the charge distribution of overtone having the resonance frequency six times as much as the frequency of fundamental vibration in case that the concave portion 11 is provided in the arm or not provided. 14 and 14' respectively show the displacement distribution and the charge distribution in case that the arm is not provided with any concave portion. 15 and 15' respectively show the displacement distribution and the charge distribution in case that the arm is provided with the concave portion 11.

FIG. 5(d) shows the quality factor of overtone with respect to the position where the concave portion is provided. The axis of adscissa shows the position where the concave portion is provided under the condition that the top of the arm is 1 (one) and that the root of the arm is zero. The axis of ordinates shows the quality factor of overtone. When the position of the concave portion is in the region of 0.65 to 0.85, the quality factor of overtone is extremely low down to several hundred to several thousand. When the position of the concave portion is not in such a region, the quality factor becomes high up to several tens of thousand to a hundred and tens of thousand. In the region of 0.65 to 0.85, the quality factor of fundamental vibration is high up to tens of thousand to a hundred and tens of thousand. Even if the quality factor of fundamental vibration varies, the quality factor of overtone is smaller as compared with that of fundamental vibration and is generally low.

As mentioned above, if the concave portion is provided in the region of 0.65 to 0.85, the displacement distribution and the charge distribution of fundamental vibration are little affected by the position of the concave portion, as shown in FIGS. 5(b) and 5(c). However, those of overtone are much affected by the position of the concave portion. By providing the concave portion, displacement of overtone at the top of the arm becomes smaller, the node gets near the top, the strain occurs in the fairly lower portion of the base portion, and so the effective length becomes pretty long. And at the same time, the charge distribution is much affected by it.

If it is desired that only overtone is suppressed without suppressing fundamental vibration, the effective lengths of them are the conclusive factor at that time. The effective length of fundamental vibration does not become much longer but that of the overtone becomes fairly longer by providing the concave portion at the top of the arm as shown in FIGS. 5(b) and 5(c).

As the tuning fork type resonator is supported at the lower portion of the base portion shown in FIG. 5(a), the strain of fundamental vibration is not suppressed by supporting member of the resonator but the strain of overtone is suppressed. Thus, only the quality factor of overtone can be lowered without lowering the quality factor of fundamental vibration by providing the concave portion in the region of 0.65 to 0.85 of the arm.

If the position of the concave portion is out of the region of 0.65 to 0.85, the displacement distribution and the charge distribution of overtone come not to be affected by the portion of the concave portion. Accordingly, the overtone is not suppressed in this case.

A 5% reduction of the resonance frequency of fundamental vibration results if the concave portion is provided in the region of 0.65 to 0.85. Therefore, it is good only to make the length (L) of the arm a little shorter so as to return the resonance frequency of fundamental vibration to the former resonance frequency.

The charge which is produced in electrodes by the concave portion is a little decreased as seen from the charge distribution of the fundamental vibration shown in FIG. 5(b), and the motional capacitance ($C_1$) in equivalent electronic circuit becomes small. That is undesirable because the region where the tunability can be obtained becomes narrower when this tuning fork type quartz crystal resonator is used in a timepiece. So, it is good to make the capacitance $C_1$ large by elongating the distance (X) from the tail to the electrode edge of the resonator shown in FIG. 5(a). Then, the amount of the charge which is produced in electrodes at the time when the resonator vibrates at overtone is decreased and the impedance becomes high, which are good results for suppress of overtone.

An advantage of this invention is that overtone can be easily suppressed by making L a little shorter and making X a little longer thereafter providing a concave portion in the region of 0.65 to 0.85. Especially, in the tuning fork type quartz crystal resonator manufactured by photo-chemical-etching techniques, it is enough only to remake a glass mask at the time of photo-chemical-etching process, so that mass production can be performed in the same manufacturing process as conventional process.

Another advantage is that the resonator is stable against the shock when it is dropped because L is a little shortened.

A further advantage is that the quality factor of overtone is generally decreased having almost no relation to the dispersion of quality factor of fundamental vibration, when a concave portion is provided in the region of 0.65 to 0.85, so that the tuning fork type quartz crystal resonator in accordance with this invention having high reliability wherein overtone is suppressed can be obtained.

As above-mentioned, a tuning fork type quartz crystal resonator wherein only overtone is suppressed without suppressing fundamental vibration, can be offered by providing concave portions in the region of 0.65 to 0.85 of arms. Especially, if this tuning fork type quartz crystal resonator is applied to a watch, time accuracy and stability against the shock at the time of dropping can be improved.

What is claimed is:

1. A tuning fork type quartz crystal resonator having the flexure mode of vibration and a mechanically supporting portion disposed below the roots of arms, and comprising the arms of said tuning fork type quartz crystal resonator provided with concave portions in the region of 0.65 through 0.85 from the roots of arms in the case where said roots of arms are 0 and top edges of arms are 1, said concave portions suppressing the generation of overtone by making the effective length of overtone longer to said supporting portion.

2. A tuning fork type resonator as claimed in claim 1, wherein said concave portion is in the form of rectangle.

3. A tuning fork type resonator as claimed in claim 1, wherein said concave portion is in the form of semicircle.

4. A tuning fork type resonator as claimed in claim 1, wherein said resonator is made by photo-chemical-etching techniques.

5. A tuning fork type resonator as claimed in claim 1, wherein said concave portion is provided at the position of 0.75.

6. A tuning fork type resonator as claimed in claim 1, wherein the length X of the electrode is longer than the length at the time when said concave portion is not provided and moreover said concave portion is provided in the region of 0.65 through 0.85.

* * * * *